United States Patent [19]
Delperier et al.

[11] Patent Number: 5,789,026
[45] Date of Patent: Aug. 4, 1998

[54] CHEMICAL VAPOR INFILTRATION PROCESS OF A PYROCARBON MATRIX WITHIN A POROUS SUBSTRATE WITH CREATION OF A TEMPERATURE GRADIENT IN THE SUBSTRATE

[75] Inventors: Bernard Delperier, Sur Jalles; Jean-Luc Domblides, Bruges, both of France

[73] Assignee: Societe Europeene de Propulsion, Suresnes, France

[21] Appl. No.: 632,487

[22] PCT Filed: Sep. 14, 1994

[86] PCT No.: PCT/FR94/01074

§ 371 Date: Apr. 25, 1996

§ 102(e) Date: Apr. 25, 1996

[87] PCT Pub. No.: WO95/11867

PCT Pub. Date: May 4, 1995

[30] Foreign Application Priority Data

Oct. 27, 1993 [FR] France .................. 93/12806

[51] Int. Cl.⁶ .................. C23C 16/26; C04B 35/83
[52] U.S. Cl. .................. 427/249; 427/122
[58] Field of Search .................. 427/249, 255.1, 427/122, 248.1; 423/446

[56] References Cited

U.S. PATENT DOCUMENTS 5,348,774 9/1994 Golecki et al. .................. 427/543

FOREIGN PATENT DOCUMENTS 2225396 11/1974 France.

OTHER PUBLICATIONS

"A Review of CVD Carbon Infiltration of Porous Substrates", W.V. Kotlensky, 16th National Sampe Symposium, Apr. 21, 1971, Anaheim, U.S.A., pp. 257–265.

Primary Examiner—Roy V. King
Attorney, Agent, or Firm—Weingarten, Schurgin, Gagnebin & Hayes LLP

[57] ABSTRACT

The substrate (10) is placed in an enclosure (12) and is heated so as to establish a temperature gradient within the substrate such that the substrate has a temperature in its portions remote from its exposed surfaces that is greater than its temperature at said surfaces. A gas constituting a precursor of carbon and comprising at least one saturated or unsaturated hydrocarbon is admitted into the enclosure, with the formation of pyrolytic carbon be favored in the higher temperature portions of the substrate. The gas comprises a mixture containing at least one saturated or unsaturated hydrocarbon and hydrogen, and the substrate is heated in such a manner as to establish a temperature gradient within the substrate on either side of a temperature of 1500 K, with hydrogen having an inhibiting role at temperatures below 1500 K.

14 Claims, 2 Drawing Sheets

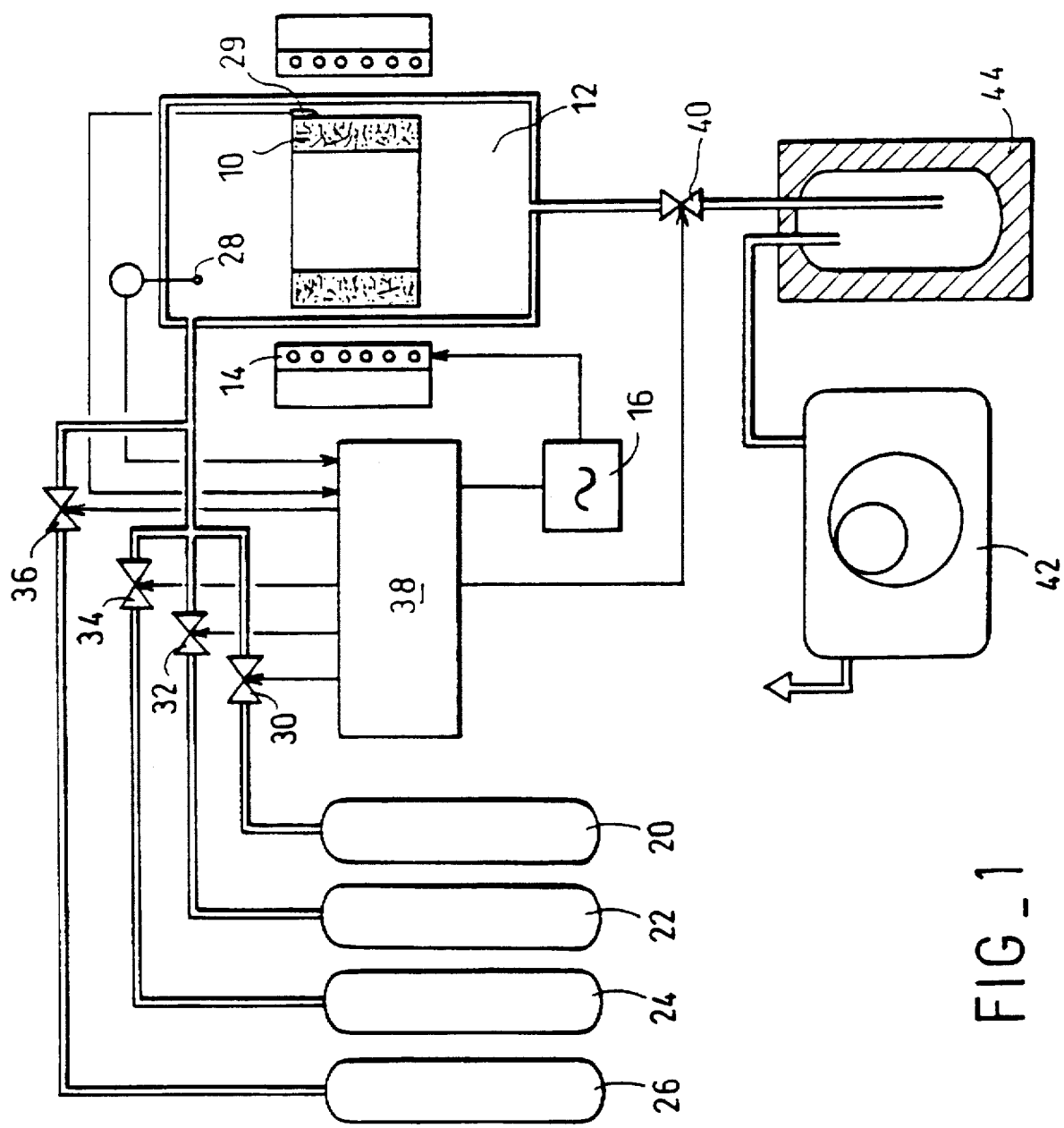
FIG_1

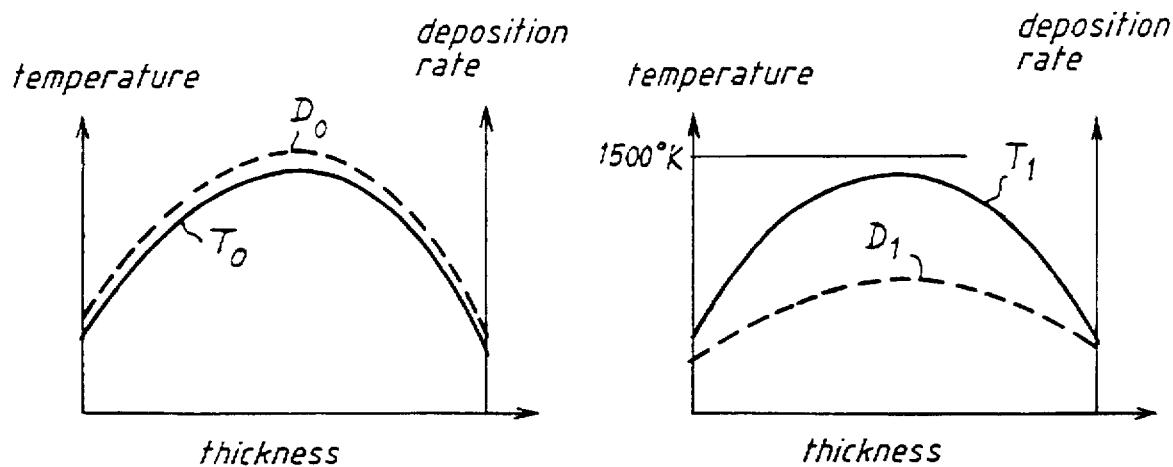
FIG_2
FIG_3
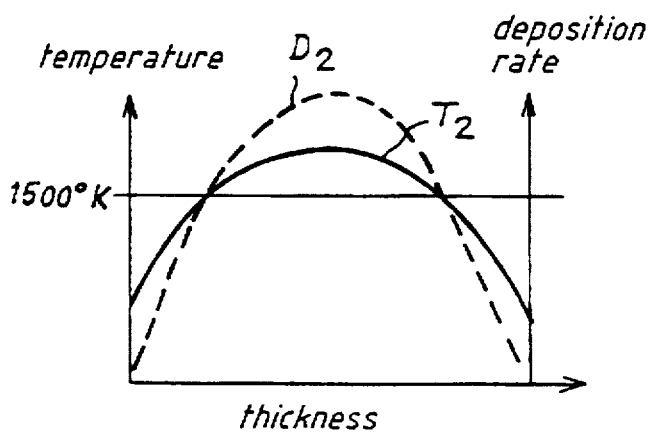
FIG_4
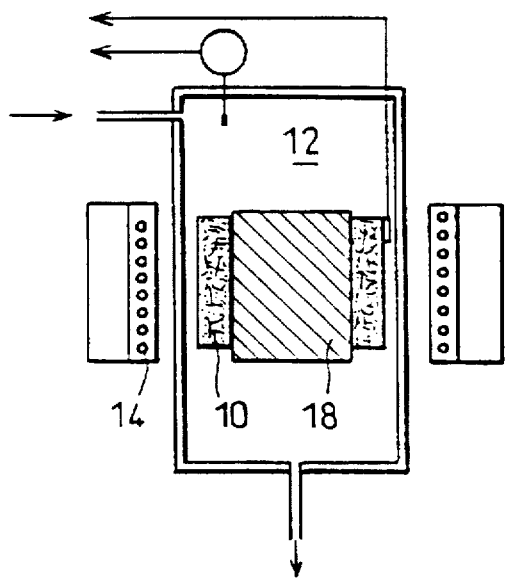
FIG_5

CHEMICAL VAPOR INFILTRATION PROCESS OF A PYROCARBON MATRIX WITHIN A POROUS SUBSTRATE WITH CREATION OF A TEMPERATURE GRADIENT IN THE SUBSTRATE

BACKGROUND OF THE INVENTION

1. Field of the Invention

The present invention relates to a chemical vapor infiltration (CVI) method of infiltrating a pyrolytic carbon matrix into a porous substrate.

The field of application of the invention is more particularly that of manufacturing parts of composite material having fiber reinforcement and a carbon matrix. The fibers are carbon or graphite fibers or fibers of a refractory material, e.g. a ceramic, optionally coated in carbon or graphite.

Chemical vapor infiltration is used to form a deposit of pyrolytic carbon on the fibers of the substrate, throughout the volume thereof, so as to bond the fibers together and fill in the pores initially in the substrate.

To perform chemical vapor infiltration, the fiber substrate is placed in an enclosure. A gas constituting a precursor of carbon is admitted into the enclosure. Under determined conditions of temperature and pressure, the gas diffuses into the substrate and forms the deposit of pyrolytic carbon on the fibers. By way of example, the gas may be constituted by a hydrocarbon or by a mixture of hydrocarbons producing pyrolytic carbon by decomposing on coming into contact with the fibers of the substrate.

Several types of CVI method are in existence: the constant temperature and pressure method, the pressure gradient method, and the temperature gradient method.

In the constant temperature and pressure method, the substrate to be densified is placed in an isothermal enclosure. Heating is provided, e.g. by means of a graphite susceptor or core surrounding the enclosure and itself surrounded by an induction winding. Energy is applied to the substrate essentially by radiation from the enclosure. The temperature inside the enclosure is regulated to the desired value by controlling the current in the winding, while the pressure is adjusted by connecting the enclosure to a vacuum source and controlling the rate at which the gas is admitted into the enclosure. Matrix material is deposited inside the substrate and on the surface thereof. The temperature and pressure are selected to have values that are only slightly greater than those required for a deposit to form, so as to avoid massive deposition on the surface of the substrate occurring immediately on contact with the gas, since that would quickly lead to the surface pores being shut off, thereby preventing densification taking place within the substrate.

Nevertheless, it is inevitable that the surface pores will be closed progressively, thereby stopping the densification process before it is complete within the core of the substrate. It is then necessary to remove surface crust by machining so as to reopen the array of pores and continue densification. Several intermediate crust-removal operations may be necessary on a single piece prior to achieving the desired degree of densification.

By accurately controlling infiltration conditions, that method makes it possible to obtain a matrix of desired quality, and to do so in reproducible manner. It also has the major advantage of enabling a plurality of pieces of various shapes to be densified simultaneously within the same enclosure.

In spite of these advantages which justify its use on an industrial scale, the constant temperature and pressure method suffers from drawbacks of lengthy duration and large cost, in particular when manufacturing composite pieces of great thickness. Densification requires deposition to take place slowly, and thus requires cycles of long duration. In addition, the intermediate machining operations for crust removal give rise to losses of material and contribute to increasing cost price, with alternation between infiltration and crust removal lengthening the total duration of manufacture and increasing its cost. Finally, in particular for pieces of great thickness, it is inevitable that a considerable densification gradient remains within a given piece, with the degree of densification being significantly less deep within the piece than at its surface.

The pressure gradient method uses a forced flow of the gas through the preform. The forced flow gives rise to a pressure difference across the piece.

In addition to requiring the gas transport system to be specially adapted, the pressure gradient method suffers from one of the same limitations as the constant temperature and pressure method. The permeability of the pores to the gas decreases rapidly with more deposit being formed on the side facing the gas inlet. It is necessary to remove crust therefrom periodically in order to enable densification to continue.

In addition, that method is applicable only to substrates of shapes that are particularly simple and limited, with each piece requiring a special gas feed and circulation device.

The temperature gradient method consists in performing non-uniform heating of the substrate so that its temperature in the vicinity of its exposed surface is lower than its inside temperature remote from the surface. Since the deposition reaction is thermally activated, deposition speed or matrix growth increases with temperature. As a result, more densification takes place in the hotter portions within the substrate than in the cooler portions at the exposed surface of the substrate. This prevents a greater deposit being formed at the surface with premature shutting of the pores, and thus prevents the need for intermediate operations. This is the type of infiltration method to which the present invention relates.

A CVI device using a temperature gradient was presented and described by W. V. Kotlensky to the "16th National SAMPE Symposium, Anaheim, Calif., April 21–23, 1971" under the title "A review of CVD carbon infiltration of porous substrates", p. 257–265, and in a work entitled "Chemistry and physics of carbon", published in the United States of America by P. L. Walker, Vol. 9, pp. 198–199.

The substrate to be densified is applied via an internal face against a graphite core. The substrate and the core are housed inside an enclosure. An induction winding surrounds the enclosure. Gas is admitted via the base of the enclosure and it flows upwards.

The core is heated by electromagnetic coupling with the winding, and it in turn heats the substrate with which it is in contact. A temperature gradient is established through the substrate between the inside face in contact with the core and the exposed outside face where a lower temperature is established because of heat losses by radiation and by convection due to the circulating gas.

The steepness of the thermal gradient is a function of the thermal conductivity of the substrate.

Another CVI technique using a temperature gradient has been described by J. J. Gebhardt et al. in an article entitled "Formation of carbon-carbon composite materials by pyrolytic infiltration", published in Petroleum derived carbons ACS Series No. 21 6/73.

In that case, the substrate to be densified is constituted by bundles of intermeshed graphite fibers oriented in seven different directions. The substrate is suspended inside an enclosure with the gas being admitted through the base thereof. The graphite fibers conduct electricity sufficiently to enable the substrate to be heated by direct coupling with an induction winding surrounding the enclosure.

The hottest zone of the substrate is situated inside the substrate, since its outside surface is cooled by radiation and by the upward flow of gas through the enclosure. A temperature gradient of a few °C. per centimeter is obtained going away from the internal portion which is the hottest.

In order to maintain a sufficient temperature gradient, the gas circulates at high speed so as to cool the surface, and the induction winding is restricted to a few turns in order to heat a limited zone of the substrate, such that a temperature gradient is also established between the portion of the substrate situated in the induction field and the portion of the substrate lying outside the field. Densification of the entire substrate is obtained by moving the substrate within the enclosure, parallel to the axis of the winding. These constraints mean that the method can be of limited use only, since it is difficult to industrialize.

An object of the present invention is to provide a CVI method of infiltrating pyrolytic carbon into a porous substrate in which a thermal gradient has been established. A particular object of the invention is to further improve the effect of the thermal gradient whereby deposition of pyrolytic carbon is favored in the internal portions of the substrate that are remote from the exposed surfaces thereof.

SUMMARY OF THE INVENTION

According to the invention, this object is achieved by a method in which the gas comprises a mixture made up of at least one saturated or unsaturated hydrocarbon and hydrogen, and the substrate is heated so as to establish therein a temperature gradient on either side of a temperature of 1500 K.

The method of the invention advantageously makes use of hydrogen's property of acting on the kinetics of chemical vapor deposition (or infiltration) of pyrolytic carbon, with an effect that varies from being inhibiting to being catalytic, merely with an increase in temperature.

When depositing pyrolytic carbon on a carbon or graphite surface, it appears that hydrogen blocks the active sites of carbon by chemisorbtion and delays nucleation of the pyrolytic carbon at a temperature of about 1300 K.

At temperatures in the range 1300 K to 1400 K, hydrogen chemisorbs and inhibits the formation of reaction species in the gas.

At higher temperature, about 1500 K to 1700 K, hydrogen activates the carbon or graphite surface and the rate of deposition on said activated surface is higher than on a non-activated surface.

The temperature gradient is established so that the hottest internal portions of the substrate are at a temperature higher than 1500° C. and the exposed external portions are at a temperature of less than 1500° C.; there is then synergy between the deposition of pyrolytic carbon being thermally activated and the catalytic or inhibiting effect of hydrogen to favor deposition in the internal portions of the substrate to the detriment of portions adjacent to the exposed surfaces. As a result the risk of surface pores being prematurely closed off is reduced and there is a reduction in the densification gradient within the product.

In the mixture of at least one saturated or unsaturated hydrocarbon and hydrogen, the volume percentage of hydrogen preferably lies in the range 10% to 50%. The saturated or unsaturated hydrocarbon is selected in particular from alkanes such as methane and propane, alkenes, alkynes, alkyles, or a mixture of a plurality thereof.

BRIEF DESCRIPTION OF THE DRAWING

The invention will be better understood on reading the following description given by way of non-limiting indication. Reference is made to the accompanying drawings, in which:

FIG. 1 is a highly diagrammatic view of an installation enabling the method of the invention to be performed;

FIGS. 2 to 4 show temperature distribution and pyrolytic carbon deposition rate in the thickness of the substrate under different conditions; and FIG. 5 shows anther implementation of the method of the invention.

DESCRIPTION OF THE PREFERRED EMBODIMENTS

FIG. 1 shows in highly diagrammatic manner an installation enabling pyrolytic carbon to be infiltrated by chemical vapor infiltration into a porous substrate heated by direct coupling with an induction winding.

The substrate 10 is disposed inside an enclosure 12. In this example, the substrate 10 is a fibrous structure in the form of an annular cylinder having a rectangular meridianal section. The substrate is heated by direct electromagnetic coupling with an induction winding 14 that surrounds the enclosure. The substrate 10 and the winding 14 are coaxial.

The winding 14 extends axially over a length that is equal to or greater than the length of the substrate 10 so that the substrate lies entirely within the electromagnetic field generated by the winding 14.

Gas suitable for forming the deposit of pyrolytic carbon on the fibers of the substrate 10 is admitted into the top of the enclosure 12. The gas comprises a mixture of at least one alkane, alkene, alkyne, or alkyle together with hydrogen, for example a mixture of methane, of propane, and of hydrogen. The methane, propane, and hydrogen are supplied from respective gas sources 20, 22, and 24 via respective injection valves 30, 32, 34.

During the CVI process, the gaseous reaction products, including the remains of the reaction gas, are extracted from the bottom of the enclosure 12. Extraction is performed by opening a valve 40 which puts the chamber into communication with a vacuum pump 42 via a liquid nitrogen trap 44 enabling undesirable gaseous species to be retained and preventing them being exhausted into the surrounding medium. Extraction of the reaction gases by means of a vacuum may be replaced or assisted by sweeping the enclosure 12 with an inert gas such as nitrogen or argon, which gas is injected into the enclosure from a source 26 via an injection valve 36.

The valves 30, 32, 34, and 36 are controlled by a controller 38. The controller receives the signal produced by a sensor 28 and representative of the pressure inside the enclosure 12, and it controls the valve 36 so that a determined pressure exists inside the enclosure before the reaction gas is admitted. The controller also controls a generator 16 that powers the winding 14 to heat the substrate under the desired conditions. For this purpose, the controller receives a signal produced by a temperature sensor 29, e.g. a thermocouple, placed in contact with an exposed surface of the substrate.

The substrate 10 is made of fibers that conduct electricity. It has characteristics of electrical resistivity and of thermal conductivity that make it suitable for being heated by direct coupling with the winding 14.

One type of structure that is particularly suitable for the substrate 10 is a structure made up of needled fibers of carbon or graphite.

A method of making such a three-dimensional structure is described in document FR-A-2 584 107. The desirable characteristics of electrical resistivity and of thermal conductivity may, for example, be those given in the French patent application filed by the Applicant on the same day as the present application and entitled "A CVI method of infiltrating a material into a fibrous substrate with a temperature gradient being established therein" to which reference is made expressly. To summarize, the radial electrical resistivity preferably lies in the range 1 m$\Omega$/cm to 20 m$\Omega$/cm, and the ratio of radial electrical resistivity to circumferential electrical resistivity is preferably not less than 1.3, while the radial thermal conductivity preferably lies in the range 0.1 W/m. °K to 20 W/m. °K and the ratio between radial thermal conductivity and circumferential conductivity is preferably not more than 0.9. These characteristics can be obtained with a fiber volume ratio, i.e. the percentage of the apparent volume of the substrate that is actually occupied by the fibers, equal to at least 20%, and preferably at least 25%.

Induction heating of the substrate is produced by the Joule effect, by means of induced currents. It is well known that such currents concentrate at the surface (skin effect), and that the concentration effect increases with increasing frequency of the currents powering the induction winding.

In spite of the skin effect, by an appropriate choice of frequency and taking account of the surface of the substrate being cooled by radiation and by convection (into the flow of gas), it is possible to obtain a temperature gradient within the substrate.

Clearly the most suitable frequency depends on several parameters: the nature of the fibers constituting the substrate, the thickness thereof, their values of electrical resistivity and thermal conductivity, . . . .

As an indication, for a needled substrate of carbon fibers obtained as described above, the optimum frequency lies in a range of about 150 Hz to about 3000 Hz, depending on the fiber volume ratio and on the thickness of the substrate.

In the example shown in FIG. 1, the substrate 10 is in the form of a cylinder of right circular section. The method of the invention may be implemented with substrates of other shapes, in particular cylindrical substrates of non-circular section or non-cylindrical substrates that are axially symmetrical, with the shape of the induction winding being adapted where appropriate.

When the induction winding 14 is powered, at the beginning of chemical vapor infiltration, a temperature profile is established inside the substrate between the inside diameter and the outside diameter thereof, as shown by curve T0 in FIG. 2. In this case, the maximum temperature is assumed to arise substantially on the mean diameter of the substrate. When the substrate is relatively large, it may move closer to the outer diameter.

The deposition rate of pyrolytic carbon is activated by the temperature of the substrate. Assuming that the gas does not include any hydrogen, then the deposition rate profile within the substrate corresponds to the temperature profile, as shown in FIG. 2 by curve D0.

As mentioned above, the presence of hydrogen in the gas that contains the precursor of pyrolytic carbon has an inhibiting effect on deposition rate when the temperature is below 1500 K, in particular over the range 1300 K to 1400 K where hydrogen chemisorbs and inhibits the formation of reaction species in the gas.

Thus, when the temperature of the hottest portions of the substrate is below 1500 K, the profile showing the distribution of deposition rates takes on the appearance of curve D1 in FIG. 3, where the temperature profile (curve T1) has substantially the same appearance as in FIG. 2. Deposition rate is considerably slowed while retaining a maximum in the hottest portions.

However, when the temperature profile covers a range extending on either side of 1500 K (curve T2 in FIG. 4) while nevertheless remaining similar in appearance to the preceding temperature profiles, the deposition rate profile takes the appearance of curve D2 in FIG. 4. In those portions of the substrate where the temperature is greater than 1500 K, the hydrogen activates the carbon or graphite surface of the fibers, thereby increasing the deposition rate relative to profile D0 of FIG. 2; however in those portions of the substrate where the temperature is lower than 1500 K, the effect of hydrogen being present is opposite, giving rise to a decrease in deposition rate. The addition of hydrogen thus amplifies the effect of the temperature gradient in a direction that favors faster deposition of pyrolytic carbon within the substrate than in the vicinity of its exposed surfaces. It is thus possible to achieve more uniform densification of the substrate.

This synergy between the temperature gradient and the presence of hydrogen takes place providing the surface of the fibers is made of carbon or of graphite. Pyrolytic carbon deposition is inhibited by hydrogen because it blocks active sites of the carbon by chemisorbtion, thereby retarding nucleation of the pyrolytic carbon, whereas pyrolytic carbon deposition is activated because the carbon surface of the fibers is activated.

The substrate is heated in such a manner as to establish the desired temperature gradient on either side of the value 1500 K. To this end, and given the nature of the substrate, the current powering the induction winding 14 is controlled by the controller 38 so that the temperature at the exposed surface of the substrate as measured by the sensor 29 is less than 1500 K, without being too low, so that the hottest portions of the substrate are at a temperature greater than 1500 K.

Preferably, it is ensured that the temperature of the substrate in the hottest portions thereof lies in the range 1500 K to 2000 K, and at its exposed surfaces lies in the range 1000 K to 1300 K.

The field of application of the invention is thus particularly that of densifying fibrous substrates made of carbon or graphite, or coated in carbon or graphite. Nevertheless, it is not necessary for the initial substrate to be made of carbon or graphite fibers, or of fibers initially coated in carbon or graphite. Once the fibers have received a coating of pyrolytic carbon at the beginning of the chemical vapor infiltration process, then the inhibiting or catalytic effect of the hydrogen can take place.

The percentage of hydrogen in the mixture constituted by at least one saturated or unsaturated hydrocarbon gas together with hydrogen lies preferably in the range 10% to 50%. When, as in the example described above, the gas is constituted by methane, propane, and hydrogen, then the volume percentage of methane lies in the range 50% to 90%, the volume percentage of propane lies in the range 0% to 50%, and the volume percentage of hydrogen lies in the range 10% to 50%.

Other alkanes, alkenes, alkynes, or alkyles could be used instead of methane and propane, or in addition thereto.

A variant implementation of the method of the invention is shown in FIG. 5 which is a fragmentary view of an installation for performing chemical vapor infiltration. Elements common to the two embodiments of FIGS. 1 and 5 are given the same references and are not described again.

The embodiment of FIG. 5 differs from that of FIG. 1 by the fact that the substrate 10 is not heated by direct coupling with the induction winding 14, but is heated by contact with a solid graphite core 18 on which the annular substrate 10 is engaged.

The electromagnetic coupling takes place essentially between the induction winding 14 and the core 18. A temperature gradient is thus established radially through the substrate 10 between a hottest inner surface in contact with the core 18 and a cooler exposed outer surface.

The effect of the temperature gradient on the deposition rate is combined with the effect of added hydrogen in the same manner as that described above, providing the temperature in the substrate drops from a value greater than 1500 K at its inner surface to a value less than 1500 K at its outer surface.

This embodiment is particularly suitable for substrates having electrical resistivity such that there can be no question of heating by direct electromagnetic coupling.

We claim:

1. A method of densifying a porous substrate with a pyrolytic carbon matrix obtained by chemical vapor infiltration, the method comprising the following steps:

placing the substrate in an enclosure;

heating the substrate so as to enable a temperature gradient to be established within the substrate so that the substrate has a higher temperature in portions remote from its exposed surfaces than at said surfaces; and admitting into the enclosure a gas that constitutes a precursor of carbon, comprising at least one saturated or unsaturated hydrocarbon, with the formation of pyrolytic carbon being favored in the higher temperature portions of the substrate;

the method being characterized in that:

the gas comprises a mixture made up of at least one saturated or unsaturated hydrocarbon together with hydrogen; and the temperature gradient established within the substrate is such that the hottest internal portions of the substrate are at a temperature which is higher than 1500 K, and at which deposition of the pyrolytic carbon is activated by the presence of hydrogen, and the exposed external portions of the substrate are at a temperature which is lower than 1500 K, and at which deposition of the pyrolytic carbon is inhibited by the presence of hydrogen.

2. A method according to claim 1, characterized in that the volume percentage of hydrogen in the mixture made up of at least one saturated or unsaturated hydrocarbon and hydrogen lies in the range 10% to 50%.

3. A method according to claim 1, characterized in that the temperature of the substrate in the hottest portions thereof lies in the range of from above 1500 K to 2000 K.

4. A method according to claim 1, characterized in that the temperature of the substrate at its exposed surfaces lies in the range 1000 K to 1300 K.

5. A method according to claim 1, characterized in that the gas comprises a mixture made up of at least one alkane selected from methane and propane, together with hydrogen.

6. A method according to claim 5, characterized in that the gas comprises a mixture made up of methane, propane, and hydrogen, in which the volume percentage of methane lies in the range 50% to 90%, the percentage of propane lies in the range 0% to 50%, and the volume percentage of hydrogen lies in the range 10% to 50%.

7. A method according to claim 1, characterized in that the substrate is made of fibers with at least the surface thereof being made of carbon or graphite.

8. A method according to claim 1, characterized in that the substrate is made of carbon or graphite fibers.

9. A method according to claim 6, characterized in that the substrate is made of fibers with at least the surface thereof being made of carbon or graphite.

10. A method according to claim 7, characterized in that the substrate is made of carbon or graphite fibers.

11. A method according to claim 2, characterized in that:

the temperature of the substrate in the hottest portions thereof lies in the range of from above 1500 K to 2000 K;

the temperature of the substrate at its exposed surfaces lies in the range 1000 K to 1300 K; and the gas comprises a mixture made up of at least one alkane selected from methane and propane, together with hydrogen.

12. A method according to claim 11, characterized in that the gas comprises a mixture made up of methane, propane, and hydrogen, in which the volume percentage of methane lies in the range 50% to 90%, the percentage of propane lies in the range 0% to 50%, and the volume percentage of hydrogen lies in the range 10% to 50%.

13. A method according to claim 12, characterized in that the substrate is made of fibers with at least the surface thereof being made of carbon or graphite.

14. A method according to claim 13, characterized in that the substrate is made of carbon or graphite fibers.

* * * * *

UNITED STATES PATENT AND TRADEMARK OFFICE
CERTIFICATE OF CORRECTION

PATENT NO  : 5,789,026
DATED      : August 4, 1998
INVENTOR(S): Bernard Delperier, et al.

It is certified that error appears in the above-identified patent and that said Letters Patent is hereby corrected as shown below:

```
Column 1, line 6, after Title, Insert,
        --CROSS REFERENCE TO RELATED APPLICATIONS
                        -n/a-
        STATEMENT AS TO RIGHTS TO INVENTIONS MADE UNDER FEDERALLY-
            SPONSORED RESEARCH AND DEVELOPMENT.
                        -n/a- --.

Column 7, line 56, claim 1, "K." should read --K,--.
```

Signed and Sealed this

Twenty-first Day of March, 2000

Attest:

Q. TODD DICKINSON

*Attesting Officer*   *Commissioner of Patents and Trademarks*